United States Patent
Deniz (10) Patent No.: US 8,580,686 B1
(45) Date of Patent: Nov. 12, 2013

(54) SILICIDATION AND/OR GERMANIDATION ON SIGE OR GE BY COSPUTTERING NI AND GE AND USING AN INTRALAYER FOR THERMAL STABILITY

(75) Inventor: Derya Deniz, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/453,740

(22) Filed: Apr. 23, 2012

(51) Int. Cl.
*H01L 21/44* (2006.01)

(52) U.S. Cl.
USPC ........... 438/680; 438/682; 438/683; 257/616; 257/E31.049

(58) Field of Classification Search
USPC ........... 438/680, 682, 683; 257/616, E31.049
See application file for complete search history.

(56) References Cited

U.S. PATENT DOCUMENTS

| | | | |
|---|---|---|---|
| 6,787,864 B2 * | 9/2004 | Paton et al. .................... | 257/412 |
| 8,102,000 B2 * | 1/2012 | Krivokapic .................... | 257/354 |
| 8,395,215 B2 * | 3/2013 | Lin ................................ | 257/347 |

OTHER PUBLICATIONS

Zhu, S., et al., Enhanced thermal stability of nickel germanide on thin epitaxial germanium by adding an ultrathin titanium layer, journal, Jul. 31, 2007, pp. 1-3, vol. 91, No. 051905, Applied Physics Letters, American Institute of Physics, United States.

* cited by examiner

*Primary Examiner* — Jarrett Stark
*Assistant Examiner* — Nicholas Tobergte
(74) *Attorney, Agent, or Firm* — Ditthavong Mori & Steiner, P.C.

(57) ABSTRACT

Formation of a semiconductor device with NiGe or NiSiGe and with reduced consumption of underlying Ge or SiGe is provided. Embodiments include co-sputtering nickel (Ni) and germanium (Ge), forming a first Ni/Ge layer on a Ge or silicon germanium (SiGe) active layer, depositing titanium (Ti) on the first Ni/Ge or Ni/Si/Ge layer, forming a Ti intermediate layer, co-sputtering Ni and Ge on the Ti intermediate layer, forming a second Ni/Ge layer, and performing a rapid thermal anneal (RTA) process.

15 Claims, 6 Drawing Sheets

SILICIDATION AND/OR GERMANIDATION ON SIGE OR GE BY COSPUTTERING NI AND GE AND USING AN INTRALAYER FOR THERMAL STABILITY

TECHNICAL FIELD

The present disclosure relates to silicidation/germanidation processes used to manufacture semiconductor devices, and more particularly to silicidation/germanidation processes used to manufacture semiconductor devices in 14 nanometer (nm) technology nodes and beyond.

BACKGROUND

As the dimensions of semiconductor devices continue to shrink, various issues arise, imposing increasing demands for methodology enabling the fabrication of semiconductor devices having high reliability and high circuit speed. For example, smaller transistors allow more transistors to be placed on a single substrate, thereby allowing relatively large circuit systems to be incorporated on a single, relatively small die area. However, semiconductor devices typically require reduced feature sizes. For example, as the gate width for transistors decreases, the gate dielectric thickness decreases as well. The decrease in gate oxide thickness is driven in part by the demands of overall device scaling. As gate conductor widths decrease, for example, other device dimensions including layer thicknesses must also decrease in order to maintain proper device operation. As the thickness of the underlying layer is reduced, it becomes increasingly important to minimize material consumption.

Nickel silicide (NiSi) or nickel germanide (NiGe) is formed on active layers to reduce contact resistance. In forming the NiSi or NiGe, part of the underlying material, silicon germanium (SiGe) or germanium (Ge), is consumed. In the manufacture of small scale products, consumption during silicidation and germanidation can degrade the junction profile, since the dopants are pushed down in the layer(s) during the manufacturing process. In addition, when dealing with small scale products, such material consumption can also result in the silicide and germanide extending deeper into the SiGe or Ge than the junction. Thus, as the thickness of the underlying layer is reduced, it becomes increasingly important to minimize material consumption.

In current processes, NiSi is axiotaxially formed on silicon (Si), which can cause thermal instabilities. Such thermal instabilities can be prevented or reduced by the addition of platinum (Pt) to the NiSi. Pt addition can also suppress the Si rich phase formation. NiGe, as formed on Ge or SiGe, however, typically does not offer axiotaxy issues. Furthermore, NiGe formation is a continuous transformation from a mixture of $Ni_5Ge_3$ and NiGe phases into NiGe at as low temperatures as >200° C., whereas NiSi forms at >300° C. after the metal rich phase and continues into a Si rich phase with increased temperatures >700° C. in a stepwise fashion.

Ge, however, typically lacks a stable oxide. As such, both aqueous and acidic chemistries attack the silicide and/or germanide during unreacted metal removal processes. In addition, SiGe or Ge consumption during silicidation and germanidation cannot be avoided if Ni is deposited and then annealed on these materials. Also, since NiGe has a lower activation energy of agglomeration than NiSi, NiGe is more susceptible to back-end-of-line (BEOL) annealing processes.

Figure 1A:
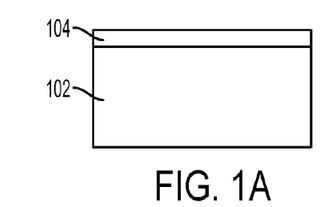
FIGS. 1A through 1C schematically illustrate a current blanket process for forming germanide.
Figure 1B:
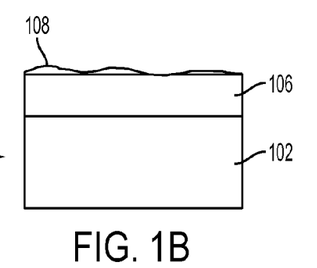
Figure 1C:
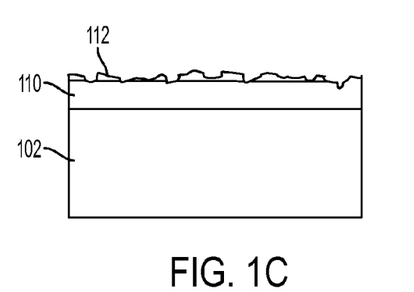

Referring to FIG. 1A through 1C, a current blanket process, for example, to form a germanide, is illustrated for simplicity. In FIG. 1A, Ni/Pt 104 is sputtered on a Ge layer 102, such as by physical vapor deposition (PVD). Then, in FIG. 1B, a rapid thermal anneal (RTA) is performed to form rich NiGe 106 on the layer 102. Subsequently, excess and un-reacted Ni/Pt 108 is stripped, for example with strong acid mixtures such as piranha (a mixture of sulfuric acid and hydrogen peroxide (SPM)) or nitric acid ($HNO_3$) in a sink bath process, typically followed by a second RTA process to transform the metal rich phases into a low resistance NiGe layer 106. However, after the second RTA, concentrated Aqua Regia (1:4) ($HNO_3$ plus hydrochloric acid (4HCl)) or a hot SPM, for example, at temperatures greater than 160° C., must be employed to remove the Pt residuals. However, as illustrated in FIG. 1C, during such process, the NiGe layer 106 is typically attacked, as illustrated by NiGe layer 110, and the un-reacted metal, such as un-reacted Pt or Ni 112, is typically not completely removed.

Figure 2A:
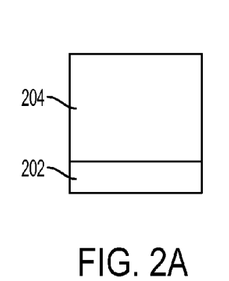
FIGS. 2A through 2F schematically illustrate a current process for forming SACs and trench silicides.
Figure 2B:
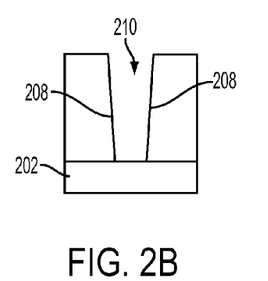
Figure 2C:
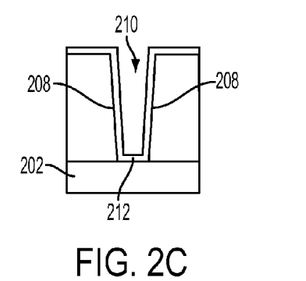
Figure 2D:
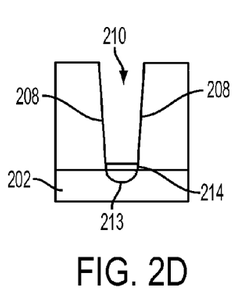
Figure 2E:
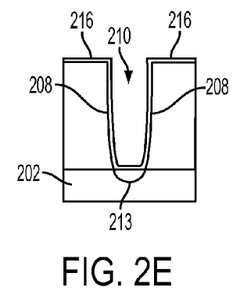

To avoid having to remove NiSi from regions other than source/drain regions, self-aligned contacts (SACs), or trench silicides, may be used. Referring to FIGS. 2A through 2F, a current process utilizing NiPt in SACs or trench silicides is described, with reference to the above described process. In FIG. 2A, an interlayer dielectric (ILD) 204, such as silicon dioxide ($SiO_2$), is formed on an active layer 202, such as of Ge or SiGe, for example at a source/drain region. In FIG. 2B, a contact etch process is performed in the ILD 204 to form a trench 210 therein having sides 208 formed by portions of the ILD 204. Then, as illustrated in FIG. 2C, nickel platinum (NiPt) (with 5, 10, 15% or higher Pt, for example) is sputtered and deposited, as by radio frequency physical vapor deposition (RFPVD), on ILD 204 and within the trench 210, forming the NiPt layer 212.

Figure 2F:
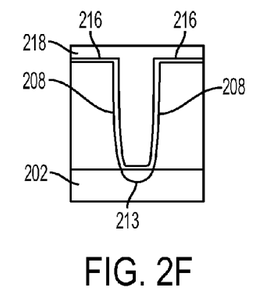

A first RTA process is performed, such as by a microwave, flash, or laser anneal process, followed a first strip process for removal of residues, followed by a second RTA process, and a second strip process for residue removal. The process results in the structure of FIG. 2D, having a silicide 213 formed in the active layer 202 at the bottom of trench 210, with an oxide layer 214 formed over silicide 213. Adverting to FIG. 2E, a sputter cleaning process, such as an argon (Ar) sputter cleaning process, is performed to remove the oxide 214 and any further residue, followed by deposition of a liner 216 covering the sides 208, ILD 204, and top of the silicide 213. As illustrated in FIG. 2F, metal 218, e.g. tungsten (W), is deposited, filling the trench 210 and covering the metal liner 216 formed over the ILD 204.

Figure 3A:
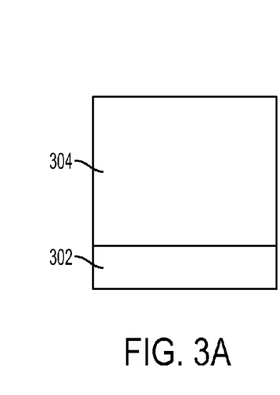
FIGS. 3A through 3G schematically illustrate an alternative process for forming SACs and trench silicides.
Figure 3B:
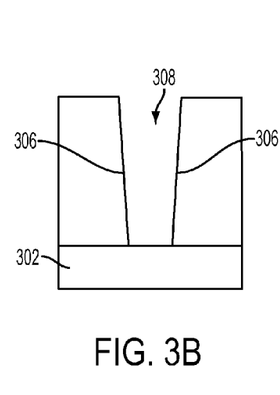
Figure 3C:
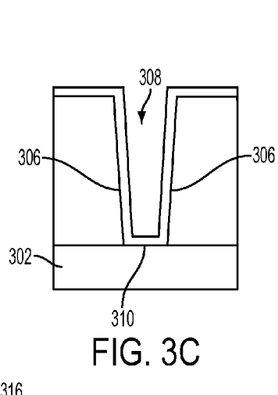

Referring to FIGS. 3A through 3G, an alternative process to that of FIGS. 2A through 2F is described. In FIG. 3A, an ILD layer 304, such as $SiO_2$, is formed on an active layer 302, such as of Ge or SiGe, for example. In FIG. 3B, the ILD 304 is etched to form a trench 308 having sides 306. Then, in FIG. 3C, RFPVD is performed to sputter and deposit NiPt (5, 10, 15% or higher Pt, for example) on the active layer 302 within the trench 308 on sides 306 and on ILD 304, forming the NiPt layer 310.

Figure 3D:
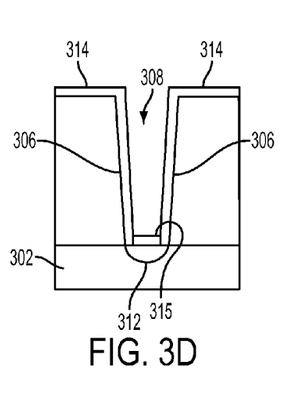
Figure 3E:
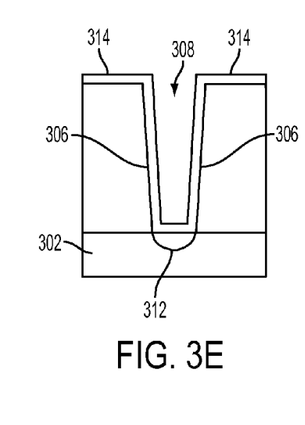
Figure 3F:
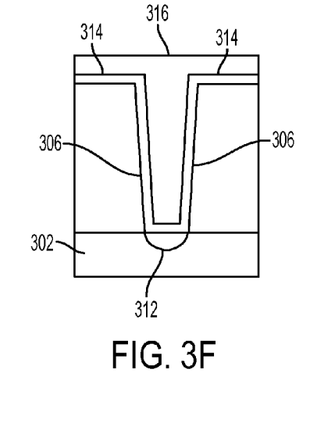
Figure 3G:
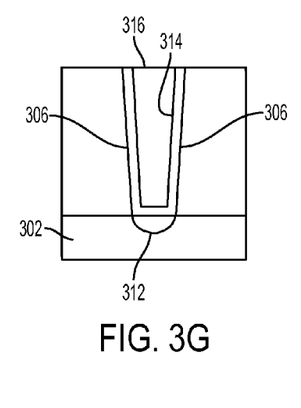

Continuing with reference to FIG. 3D, a first RTA process is performed, such as by a microwave, flash, or laser anneal process. Unlike the process of FIGS. 2A through 2F, a strip process is not performed. Instead, a silicide 312 is formed in the active layer 302 at the bottom of the trench, with an oxide layer 315 over the silicide 312, and the remaining metal forms a liner 314 covering the sides 306 and ILD 304. In FIG. 3E, a pre-clean process, such as an Ar sputter cleaning process, is performed to remove oxide layer 315. Then, as illustrated in FIG. 3F, metal 316, such as W is deposited over ILD 304 and in trench 308. In FIG. 3G, a chemical-mechanical polishing (CMP) process is performed down to ILD 304 to remove the metal 316 and the liner 314 above trench 308 and ILD 304, respectively, resulting in the structure of FIG. 3G.

Additionally, it is known that thermal stability of NiGe films formed on Ge or SiGe can be improved from 450° C. to 550° C. by adding an ultrathin (~1 nm) Ti layer during Ni deposition, either as an intermediate layer between Ni and Ge or as a capping layer on Ni, such as by the formation of a ternary $Ni_{1-x}Ti_xGe$ phase near the NiGe surface, which suppresses agglomeration of the underlying NiGe film. However, this process, while possibly improving thermal stability of NiGe, does not address problems related to unreacted metal in the strip processes and underlying material consumption.

A need therefore exists for methodology enabling formation of NiGe or NiSiGe with reduced Ge or SiGe consumption, and the resulting product.

SUMMARY

An aspect of the present disclosure is a method of manufacturing of a semiconductor device in which a layer of Ti is formed between two layers of co-sputtered Ni and Ge on a Ge active layer.

Another aspect of the present disclosure is a semiconductor device including a layer of NiTiGe between two layers of NiGe on a Ge active layer.

Another aspect of the present disclosure is a method of manufacturing of a semiconductor device in which a layer of Ti is formed between two layers of co-sputtered Ni and Ge on a SiGe active layer.

Another aspect of the present disclosure is a semiconductor device including a layer of NiTiSiGe between two layers of NiGe and SiGe active layer.

Additional aspects and other features of the present disclosure will be set forth in the description which follows and in part will be apparent to those having ordinary skill in the art upon examination of the following or can be learned from the practice of the present disclosure. The advantages of the present disclosure can be realized and obtained as particularly pointed out in the appended claims.

According to the present disclosure, some technical effects can be achieved in part by a method including co-sputtering Ni and Ge forming a first Ni/Ge layer on a Ge or SiGe active layer, depositing titanium (Ti) on the first Ni/Ge layer forming a Ti intermediate layer, co-sputtering Ni and Ge on the Ti intermediate layer forming a second Ni/Ge layer, and performing an RTA process.

Aspects of the disclosure include the active layer including $Si_{1-x}Ge_x$ wherein $0.5<x\le1$. Further aspects include co-sputtering Ni and Ge to form the first and second Ni/Ge layer in a 1:1 atomic ratio PVD, RFPVD, chemical vapor deposition (CVD) or atomic layer deposition (ALD). Other aspects include forming the first Ni/Ge layer to a thickness of 1 to 10 nm, for example 2 nm, and the second Ni/Ge layer to a thickness of 1 nm to 20 nm, e.g. 8 nm. Another aspect includes depositing Ti to form the Ti intermediate layer to a thickness of 1 to 10 nm, for example 1 nm. Additional aspects include performing the RTA process at a temperature of 200° C. to 400° C. and for a time period of 30 seconds. Further aspects include forming an ILD on the active layer, forming a trench in the ILD, and forming the first Ni/Ge layer on the active layer at the bottom of the trench. Another aspect includes depositing a metal in the trench and over the ILD subsequent to performing the RTA process. Other aspects include polishing down to a top surface of the ILD subsequent to depositing the metal.

Another aspect of the disclosure includes a device including an active layer comprising $Si_{1-x}Ge_x$, wherein $0.5<x\le1$; a first NiGe or NiGeSi layer formed on the active layer; a NiTiGe or NiTiGeSi alloy layer formed on the first NiGe or NiGeSi layer, respectively, and a second NiGe layer on the NiTiGe or NiTiGeSi alloy layer.

Aspects include the first NiGe or NiGeSi layer having a thickness of 1 nm to 10 nm. Other aspects include the NiTiGe or NiTiGeSi alloy layer having a thickness of 1 nm to 10 nm. Further aspects include the second NiGe layer having a thickness of 1 nm to 20 nm. Additional aspects include an interlayer dielectric (ILD) on the active layer and having a trench formed therethrough, wherein the first NiGe or NiGeSi layer, the NiTiGe or NiTiGeSi alloy layer, and the second NiGe layer are formed in the trench.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments can be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 4A:
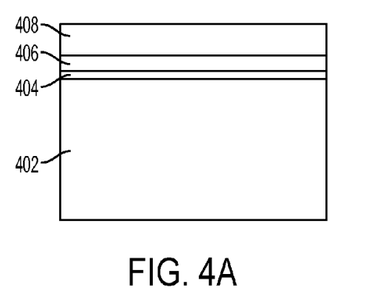
FIGS. 4A and 4B schematically illustrate a blanket germanidation process, in accordance with an exemplary embodiment of the present disclosure.
Figure 4B:
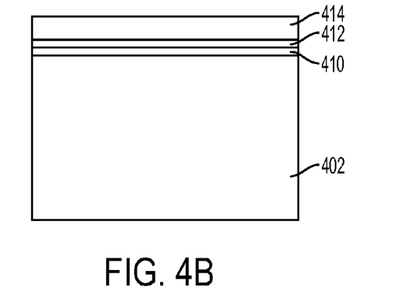
Figure 6:
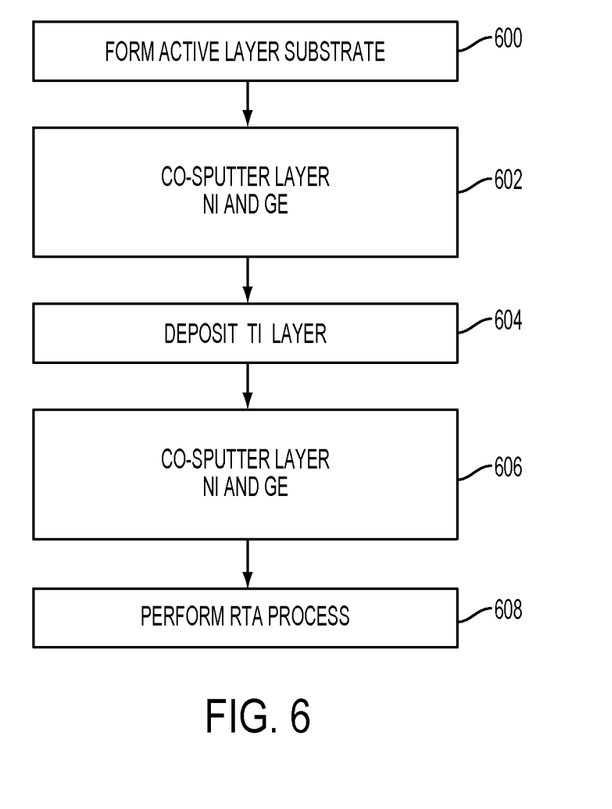
FIG. 6 is a process flow for a silicidation/germanidation process, in accordance with exemplary embodiments of the present disclosure.

Referring now to FIGS. 4A, 4B, and 6, exemplary processes for silicidation/germanidation are illustrated, according to an exemplary embodiment. Adverting to FIGS. 4A, 4B, and 6, the process begins at Step 600 with the formation of an active layer 402 of Ge or SiGe, e.g. at source/drain regions, according to known processes. The thickness of the SiGe or Ge active layer 402 is 10 nm to 100 nm, for example 30 nm, although the thickness typically can vary depending on the resultant product. Although the concentration of Ge typically is greater than 10%, in accordance with the present disclosure, the composition of the SiGe is $Si_{1-x}Ge_x$ ($0.5 \leq x \leq 1$), ranging from a layer that is half Si to a layer of pure Ge.

The process then proceeds to Step 602 of FIG. 6, where Ni and Ge, in an atomic ratio in a range of 1:10 to 10:1, for example in a 1:1 atomic ratio, are co-sputtered to a thickness of 1 nm to 10 nm, e.g., 2 nm, by a PVD, RFPVD, CVD or ALD process on active layer 402 of SiGe or Ge. The co-sputtering process forms a Ni/Ge layer 404 on the active layer 402, as illustrated in FIG. 4A. The co-sputtering of Ni and Ge may be performed at room temperature, as well as at elevated temperatures up to 400° C.

Adverting to Step 604 in FIG. 6, as illustrated in FIG. 4A, a thin layer 406 of Ti is deposited on the Ni/Ge layer 404 to a thickness of 1 nm to 10 nm, for example 1 nm, using a PVD, RFPVD, CVD or ALD process, forming an intermediate Ti layer 406. The Ti deposition may be performed at room temperature to 400° C., for example. As an alternative to the Ti, Ta, or any noble (refractory) metal whose silicide has low resistivity may be employed. Use of the Ti intermediate layer 406 can substantially eliminate or significantly reduce diffusion, as well as possibly reduce consumption, of the underlying Ge or SiGe material.

As illustrated in FIGS. 4A and 6, the process continues with Step 606 in which Ni and Ge, in an atomic ratio in a range of from 1:10 to 10:1, for example in a 1:1 atomic ratio, are co-sputtered on the intermediate Ti layer 406 to a thickness of 1 nm to 20 nm, e.g. to a thickness of 8 nm, using a PVD, RFPVD, CVD or ALD process. A Ni/Ge layer 408 is thereby formed on the Ti intermediate layer 406. The co-sputtering of Ni and Ge to form the layer 408 may be performed at room temperature, as well as at elevated temperatures, e.g. up to 400° C.

Referring to FIGS. 4A, 4B and 6, the process then continues at Step 608, with an RTA process, at a temperature in a range of 200° C. to 400° C., for example 250° C. The RTA may be performed via flash, microwave or laser anneals for 1 nano second to 300 seconds, e.g. flash anneal for 30 seconds. The RTA process at Step 608 transforms the structure of FIG. 4A into the resultant structure or resultant product of FIG. 4B. Advantageously, according to aspects of the invention, a second RTA process is not required as used in conventional processes.

The addition of the Ti intermediate layer 406 between the NiGe layer 404 and the NiGe layer 408 promotes a substantial reduction in agglomeration, whereby the alloyed Ti intermediate layer 406, as the layer 412, can reduce the free energy of the system, thereby creating larger grains. The larger the grains typically enhance higher thermal stability of a NiGe system. The layer 412, can also reduce Ge from diffusing from the underlying SiGe or Ge process of the layer 402 into the NiGe layer 404, The underlying material for layer 402, $Si_{1-x}Ge_x$ ($0.5 < x \leq 1$), for example, is advantageously not substantially consumed. Moreover, a metal strip process is typically not required.

The structure of FIG. 4B that results from the RTA process at Step 608, when Ni/Ge is used to form the layers 404 and 408, includes the active layer 402 and a NiGe layer 410. The NiGe layer 410 resulting from the RTA process is 1 nm to 10 nm in thickness, for example. Also from the RTA process, a thin alloy of $Ni_{1-x}Ti_xGe$ is formed as intermediate layer 412 on the NiGe layer 410. For the $Ni_{1-x}Ti_xGe$ intermediate layer 412, "x" is in the range of $0 < x \leq 1$, and the thickness of the $Ni_{1-x}Ti_xGe$ layer 412 ranges from 1 nm to 10 nm The $Ni_{1-x}Ti_xGe$ intermediate layer 412 can effectively minimize and substantially eliminate Ge in the Ge or SiGe layer 402 from diffusing into the NiGe layer 410.

In addition, from the RTA process at Step 608, a NiGe layer 414 is formed on the $Ni_{1-x}Ti_xGe$ intermediate layer 412. The RTA process, for example, transforms the Ni/Ge layer 404 and the Ni/Ge layer 408, by germanidation, from Ni+Ge to NiGe or $Ni_5Ge_3$+NiGe to NiGe only, forming the NiGe layers 410 and 414. Although NiGe is formed for the layer 404, where the active layer 402 is a relatively pure form of Ge, when the active layer 402 is a SiGe, a complex system, i.e. a nickel germano-silicide system (NiGeSi), is formed for the layer 404.

Adverting to FIGS. 5A through 5G, silicidation/germanidation processes in SACs and trench silicides are illustrated, based on the described exemplary processes of FIGS. 4A, 4B, and 6, in accordance with exemplary embodiments.

Figure 5A:
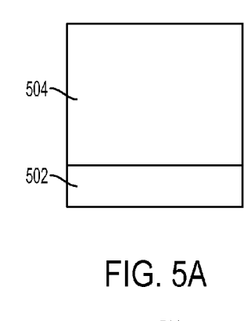
FIGS. 5A through 5G schematically illustrate a silicidation/germanidation process in SACs and trench silicides, in accordance with an exemplary embodiment.
Figure 5B:
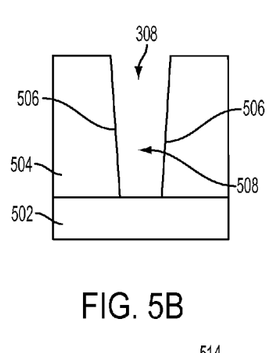
Figure 5C:
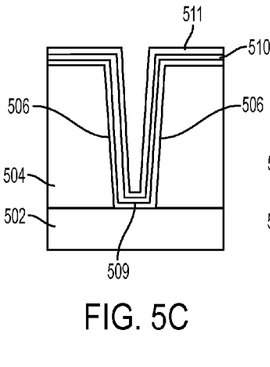

Referring to FIG. 5A, an ILD 504, such as $SiO_2$ is formed on an active layer 502, such as of Ge or SiGe. In FIG. 5B, a contact etch process is performed in the ILD 504 to form a trench 508 therein having sides 506. According to FIG. 5C, a co-sputtering process is performed where Ni/Ge layer 509 is formed on the sides 506 and bottom of the trench 508, similar to the layer 404 of FIG. 4A, followed by depositing a Ti layer 510 on the Ni/Ge layer 509, similar to the Ti layer 406 of FIG. 4A, and finally followed by co-sputtering another Ni/Ge layer 511, similar to the layer 408 of FIG. 4A, on the Ti layer 510.

Figure 5D:
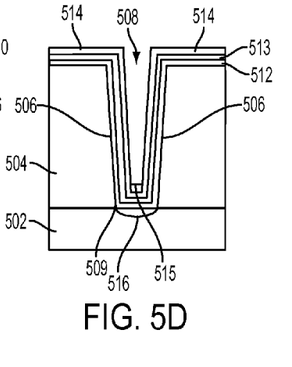

As illustrated in FIG. 5D, an RTA process is performed, similar to that performed at Step 608 of FIG. 6B, for example by a microwave, a flash, or laser anneal process. However, no chemical strip process is performed on the structure of FIG. 5D. Also, advantageously, according to aspects of the invention, a second RTA process is likewise not necessary, particularly since Pt is not required and NiGe is used, as in the previously described processes. The RTA process accomplishes the germanidation/silidation forming the NiGe or NiGeSi layers 512, the NiTiGe or NiTiSiGe layer 513, and the NiGe layer 514 similar to the NiGe layer 410, the NiTiGe layer 412, and the second NiGe layer 414. In formation of the layer 516, consumption of the Ge of the active layer 502 is minimized or eliminated. Also, after the RTA process an oxide layer 515 is formed on the bottom of the trench 508 due to air break between processes.

Figure 5E:
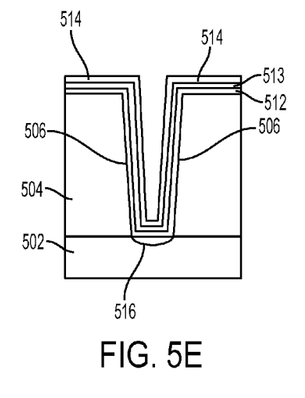
Figure 5F:
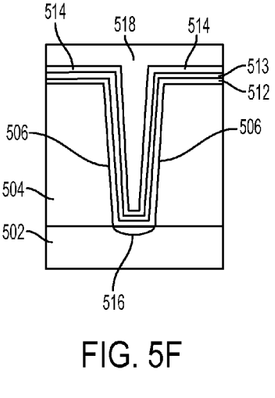
Figure 5G:
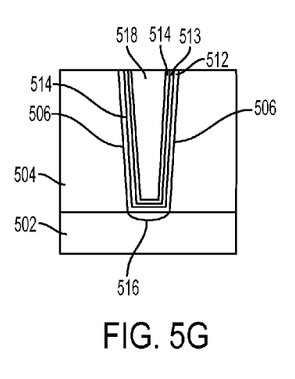

Adverting to FIG. 5E, a pre-clean process, such as an Ar sputter cleaning process, is performed substantially removing the oxide layer 515. As illustrated in FIG. 5F, a metallization process is performed, filling the trench with metal 518, such as W, Co, or Cu. The metal 518 not only fills the trench 508, but also covers the layer 514 over ILD 504. Then, in FIG. 5G, a planarization process, e.g. CMP, is performed to remove the metal 518 down to layer 514.

Therefore, in accordance with embodiments of the present disclosure, processes are provided that use NiGe or NiSiGe that advantageously do not offer axiotaxy issues. Also, NiGe, or NiSiGe, layer formation is typically a single step RTA process, according to aspects of the invention.

The embodiments of the present disclosure can achieve several desirable technical effects, such as substantially minimizing consumption of underlying Ge or SiGe. Furthermore, for SACs or trench silicide, W metallization may be completed without an unreacted metal strip and second RTA following the germanidation, silicidation, or germano-silicidation. The present disclosure enjoys industrial applicability in any of various highly integrated semiconductor process technologies and products, and, as such, is particularly advantageous in the manufacture of small scale semiconductor devices, particularly for 14 nm technology nodes and beyond.

In the preceding description, the present disclosure is described with reference to specifically exemplary embodiments thereof. It will, however, be evident that various modifications and changes can be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   co-sputtering nickel (Ni) and germanium (Ge), forming a first Ni/Ge layer on a Ge or silicon germanium (SiGe) active layer;
   depositing titanium (Ti) on the first Ni/Ge layer, forming a Ti intermediate layer;
   co-sputtering Ni and Ge on the Ti intermediate layer, forming a second Ni/Ge layer; and
   performing a rapid thermal anneal (RTA) process.

2. The method according to claim 1, wherein the active layer comprises $Si_{1-x}Ge_x$ wherein $0.5 < x \leq 1$.

3. The method according to claim 1, comprising:
   co-sputtering Ni and Ge to form the first and second Ni/Ge layer in a 1:1 atomic ratio by physical vapor deposition (PVD).

4. The method according to claim 1, comprising forming the first Ni/Ge layer to a thickness of 1 nm to 10 nm and the second Ni/Ge layer to a thickness of 1 nm to 20 nm.

5. The method according to claim 4, comprising forming the first Ni/Ge layer to a thickness of 2 nm and the second Ni/Ge layer to a thickness of 8 nm.

6. The method according to claim 1, comprising depositing titanium (Ti) to form the Ti intermediate layer to a thickness of 1 nm to 10 nm.

7. The method according to claim 6, comprising depositing titanium (Ti) to form the Ti intermediate layer to a thickness of 1 nm.

8. The method according to claim 1, comprising performing the RTA process at a temperature of 200° C. to 400° C.

9. The method according to claim 1, comprising performing the RTA process for a time period of 1 nanosecond to 300 seconds.

10. The method according to claim 1, further comprising forming an interlayer dielectric (ILD) on the active layer, forming a trench in the ILD, and forming the first Ni/Ge layer on the active layer at the bottom of the trench.

11. The method according to claim 10, further comprising depositing a metal in the trench and over the ILD subsequent to performing the RTA process.

12. The method according to claim 11, further comprising polishing down to a top surface of the ILD subsequent to depositing the metal.

13. A method comprising:
   co-sputtering nickel (Ni) and germanium (Ge), forming a first Ni/Ge layer, having a thickness of 1 nm to 10 nm, on a Ge or silicon germanium (SiGe) active layer;
   depositing titanium (Ti) on the first Ni/Ge layer, forming a Ti intermediate layer, having a thickness of 1 nm to 10 nm;
   co-sputtering Ni and Ge on the Ti intermediate layer, forming a second Ni/Ge layer, having a thickness of 1 nm to 20 nm; and
   performing a rapid thermal anneal (RTA) process at a temperature of 200° C. to 400° C. for a time period of 30 seconds.

14. The method according to claim 13, further comprising forming an interlayer dielectric (ILD) on the active layer, forming a trench in the ILD, and forming the first Ni/Ge layer on the active layer at the bottom of the trench, and filling the trench with metal subsequent to performing the RTA process.

15. The method according to claim 13, comprising:
   forming the first Ni/Ge layer to a thickness of 2 nm;
   forming the Ti intermediate layer to a thickness of 1 nm; and
   forming the second Ni/Ge layer, having a thickness of 8 nm.

* * * * *